United States Patent [19]

Eichelberger et al.

[11] Patent Number: 5,452,182
[45] Date of Patent: Sep. 19, 1995

[54] FLEXIBLE HIGH DENSITY INTERCONNECT STRUCTURE AND FLEXIBLY INTERCONNECTED SYSTEM

[75] Inventors: Charles W. Eichelberger, Schenectady; William P. Kornrumpf, Albany; Robert J. Wojnarowski, Ballston Lake, all of N.Y.

[73] Assignee: Martin Marietta Corporation, Bethesda, Md.

[21] Appl. No.: 865,786

[22] Filed: Apr. 7, 1992

Related U.S. Application Data

[63] Continuation of Ser. No. 504,769, Apr. 5, 1990, abandoned.

[51] Int. Cl.6 .................. H05K 1/11; H05K 1/14; H05K 1/18
[52] U.S. Cl. .................. 361/749; 174/254; 257/684; 257/700; 361/761; 361/762; 361/764; 361/776; 361/780; 361/792; 361/755
[58] Field of Search .................. 174/254, 255; 357/65, 357/71, 80; 361/398, 748, 749, 760, 761, 762, 764, 776, 780, 752–755; 257/684, 700

[56] References Cited

U.S. PATENT DOCUMENTS

| | | | |
|---|---|---|---|
| 3,427,715 | 2/1969 | Mika | 361/398 |
| 3,614,832 | 10/1971 | Chance et al. | 361/401 |
| 3,868,724 | 2/1975 | Perrino | 357/71 |
| 3,903,590 | 9/1975 | Yokogawa | 357/80 |
| 4,246,595 | 1/1981 | Noyori et al. | 357/71 |
| 4,480,288 | 10/1984 | Gazdik et al. | 361/398 |
| 4,495,546 | 1/1985 | Nakamura et al. | 361/398 |
| 4,510,551 | 4/1985 | Brainard, II | 361/398 |
| 4,544,989 | 10/1985 | Nakabu et al. | 361/386 |
| 4,644,443 | 2/1987 | Swensen et al. | 361/384 |
| 4,677,528 | 6/1987 | Miniet | 361/399 |
| 4,714,516 | 12/1987 | Eichelberger et al. | 156/628 |
| 4,728,834 | 3/1988 | Kumar et al. | 361/398 |
| 4,744,008 | 5/1988 | Black et al. | 361/398 |
| 4,751,564 | 6/1988 | Landis | 357/75 |
| 4,780,177 | 10/1988 | Wojnarowski et al. | 156/643 |
| 4,783,695 | 11/1988 | Eichelberger et al. | 357/65 |
| 4,808,769 | 2/1989 | Nakano et al. | 174/255 |
| 4,810,917 | 3/1989 | Kumar et al. | 361/398 |
| 4,835,704 | 5/1989 | Eichelberger et al. | 364/490 |
| 4,866,501 | 9/1989 | Shanefield | 357/71 |
| 4,878,991 | 11/1989 | Eichelberger et al. | 156/630 |
| 4,882,200 | 11/1989 | Liu et al. | 427/53.1 |
| 4,884,122 | 11/1989 | Eichelberger et al. | 357/71 |
| 4,894,115 | 1/1990 | Eichelberger et al. | 156/643 |
| 4,897,153 | 1/1990 | Cole et al. | 156/643 |
| 4,933,042 | 6/1990 | Eichelberger et al. | 156/239 |
| 4,933,810 | 6/1990 | Cardashian et al. | 361/398 |
| 4,960,613 | 10/1990 | Cole et al. | 427/53.1 |
| 5,048,179 | 9/1991 | Shindo et al. | 357/80 |
| 5,081,563 | 1/1992 | Feng et al. | 357/68 |
| 5,220,488 | 6/1993 | Denes | 361/398 |

FOREIGN PATENT DOCUMENTS

| | | |
|---|---|---|
| 0065425 | 11/1982 | European Pat. Off. . |
| 0149317 | 7/1985 | European Pat. Off. . |
| 2382101 | 9/1978 | France ............... 357/65 |
| 2447653 | 4/1976 | Germany ............ 174/254 |
| 3302857 | 8/1984 | Germany ............ 361/397 |
| 0002173 | 1/1977 | Japan ................. 357/65 |
| 0016166 | 2/1977 | Japan ................. 357/65 |
| 52-40972 | 3/1977 | Japan ................. 357/70 |
| 52-49783 | 4/1977 | Japan ................. 257/688 |
| 53-66166 | 6/1978 | Japan ................. 361/392 |
| 57-12536 | 3/1982 | Japan ................. 357/71 |
| 57-12537 | 3/1982 | Japan ................. 357/71 |
| 57-04161 | 11/1982 | Japan . |
| 59-44849 | 3/1984 | Japan . |
| 62-30342 | 2/1987 | Japan ................. 357/70 |
| 62-158337 | 7/1987 | Japan ................. 357/80 |
| 63-79365 | 4/1988 | Japan ................. 357/81 |
| 2153144 | 8/1985 | United Kingdom ... 357/75 |
| 9015438 | 12/1990 | WIPO . |

*Primary Examiner*—Leo P. Picard
*Assistant Examiner*—Donald A. Sparks
*Attorney, Agent, or Firm*—Marvin Snyder; Geoffrey H. Krauss

[57] ABSTRACT

A flexible high density interconnect structure is provided by extending the high density interconnect structure beyond the solid substrate containing the chips interconnected thereby. During fabrication, the flexible portion of the high density interconnect structure is supported by a temporary interconnect support to facilitate fabrication of the structure in accordance with existing fabrication techniques. Subsequently, that temporary support structure may be removed or may remain in place if it sufficiently flexible to impart the desired degree of flexibility to that portion of the high density interconnect structure. Methods of fabrication are also disclosed.

17 Claims, 15 Drawing Sheets

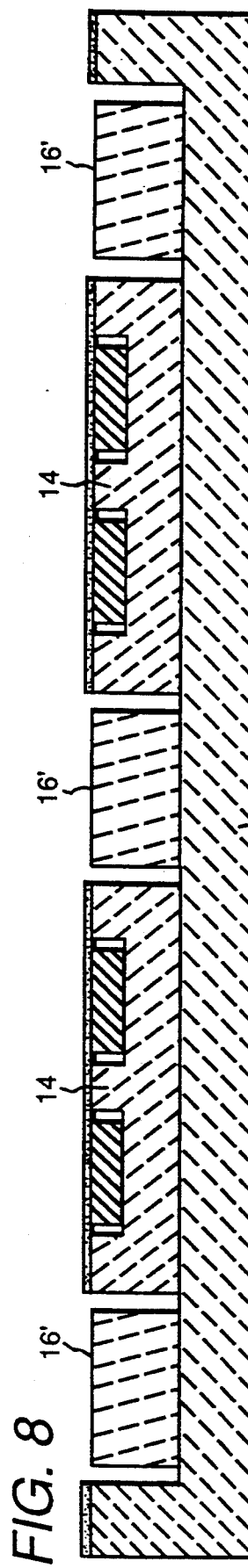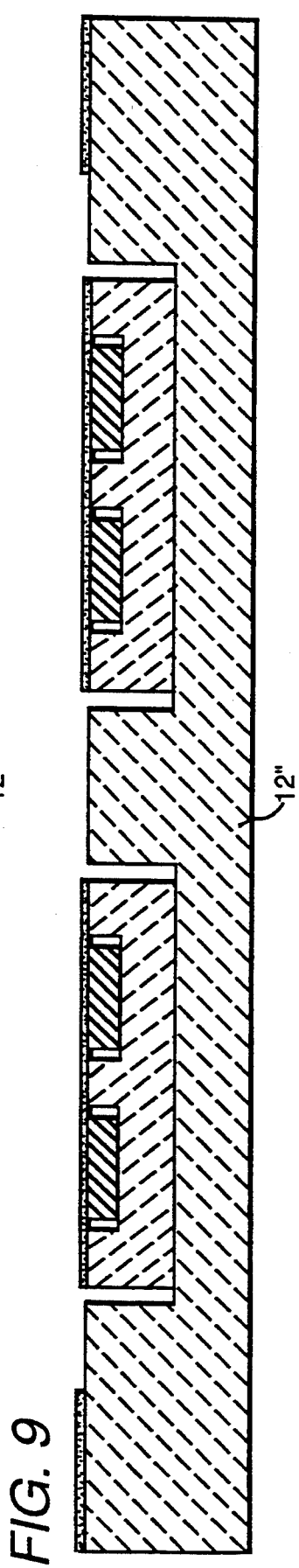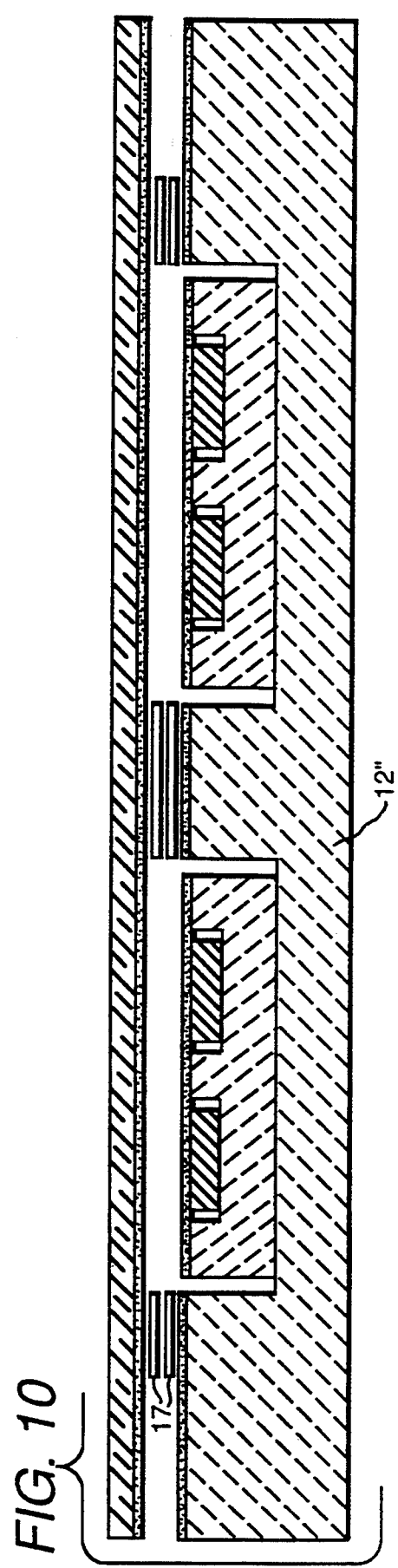

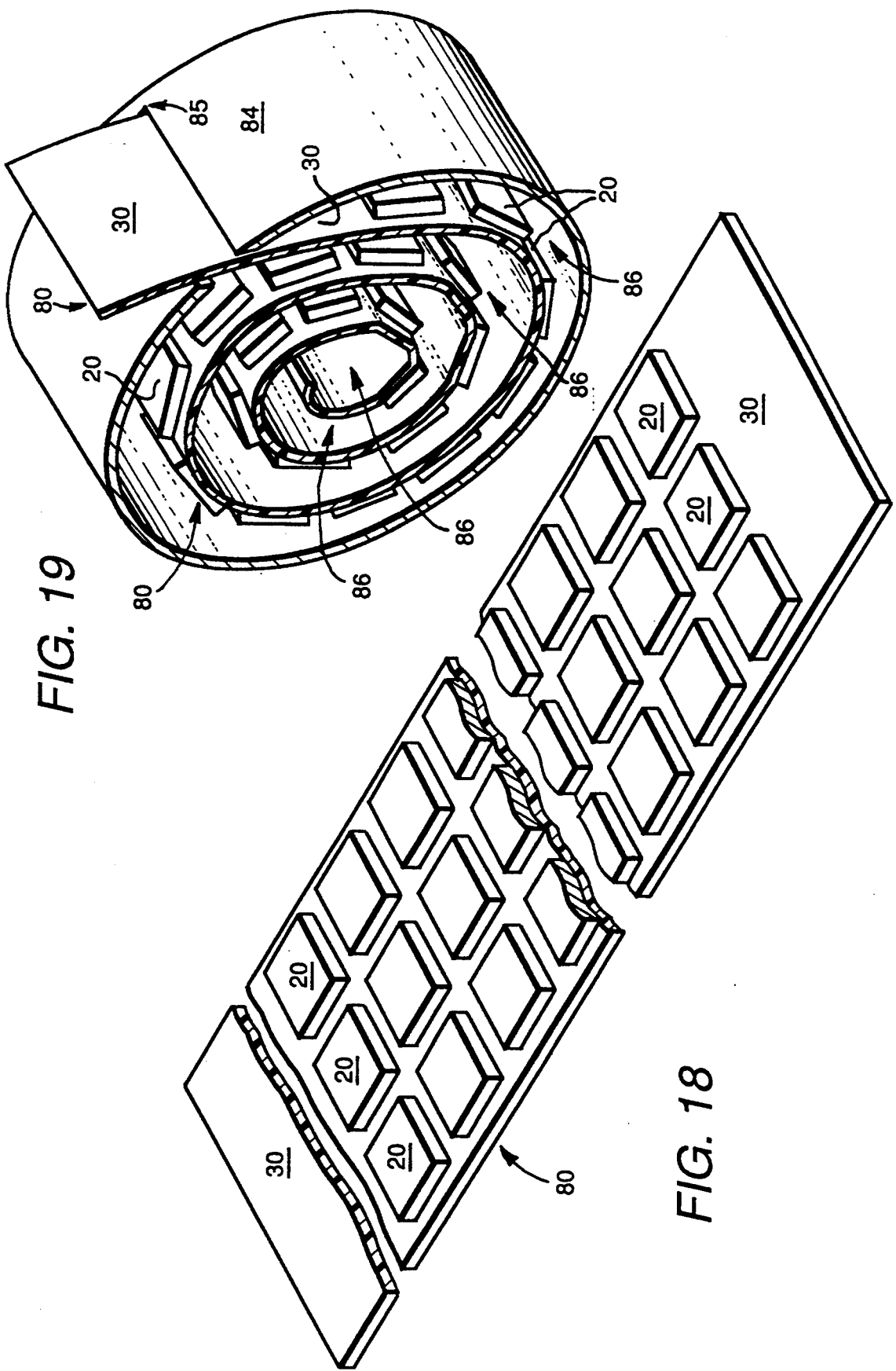

FLEXIBLE HIGH DENSITY INTERCONNECT STRUCTURE AND FLEXIBLY INTERCONNECTED SYSTEM

This application is a continuation of application Ser. No. 07/504,769, filed Apr. 5, 1990 is now abandoned.

RELATED APPLICATIONS

The present application is related to patent application Ser. No. 07/504,821, entitled, "High Density Interconnected Microwave Circuit Assembly", by W. P. Kornrumpf, et al.; application Ser. No. 07/504,803, entitled, "Microwave Component Test Method and Apparatus", by W. P. Kornrumpf, et al., application Ser. No. 07/504,803, entitled, "A Compact High Density Interconnected Microwave System", by W. P. Kornrumpf, application Ser. No. 07/504,769, entitled, "An Ultrasonic Array With a High Density of Electrical Connections", by L. S. Smith et al., application Ser. No. 07/504,751, entitled, "Compact, Thermally Efficient Focal Plane Array and Testing and Repair Thereof" by W. P. Kornrumpf, et al., all filed concurrently herewith and incorporated herein by reference in their entireties.

BACKGROUND OF THE INVENTION

Field of the Invention

The present invention relates to the field of multicomponent or multi-chip circuits, and more particularly, to high density interconnection of multiple components or chips.

Background Information

A high density interconnect (HDI) structure or system which has been developed by General Electric Company offers many advantages in the compact assembly of digital and other electronic systems. For example, an electronic system such as a micro computer which incorporates between 30 and 50 chips can be fully assembled and interconnected on a single substrate which is 2 inches long by 2 inches wide by 0.050 inch thick. The maximum operating frequency of such systems is normally, at present, less than about 50 MHz. Even more important than the compactness of this high density interconnect structure is the fact that it can be disassembled for repair or replacement of a faulty component and then reassembled without significant risk to the good components incorporated within the system. This reworkability or repairability is a substantial advance over prior connection systems in which reworking the system to replace damaged components was either impossible or involved substantial risk to the good components.

Briefly, in this high density interconnect structure, a ceramic substrate such as alumina which may be 100 mils thick and of appropriate size and strength for the overall system, is provided. This size is typically less than 2 inches square. Once the position of the various chips has been specified, individual cavities or one large cavity having appropriate depths at the intended locations of the various chips are prepared. This may be done by starting with a bare substrate having a uniform thickness and the desired size. Laser milling is used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of that component in substantially the same plane as the upper surface of the rest of the components and the surface of the portion of the substrate which surrounds the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C. depending on the formulation used) and then cooled to thermoplastically bond the individual components to the cavity. At this stage, the upper surfaces of all components and the substrate are disposed in substantially a common plane. Thereafter, a polyimide film which may be Kapton ® polyimide, available from E.I. du Pont de Nemours Company, which is about 0.0005–0.003 inch (12.5–75 microns) thick is pretreated to promote adhesion and coated on one side with an ULTEM ® polyetherimide resin or another thermoplastic and laminated across the top of the chips, other components and the substrate with the ULTEM ® resin serving as a thermoplastic adhesive to hold the Kapton ® in place. Thereafter, via holes are laser drilled in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser to provide an accurately aligned conductor pattern at the end of the process.

Additional dielectric and metallization layers are provided as required in order to provide all of the desired electrical connections among the chips. Any missposition of the individual electronic components and their contact pads is compensated for by an adaptive laser lithography system which is the subject of some of the U.S. Patents and patent applications which are listed hereinafter.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al.; U.S. Pat. No. 4,894,115 issued Jan. 16, 1990 entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. Pat. No. 4,878,991 issued Nov. 7, 1989, entitled "Simplifie Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. Pat. No. 4,960,613 issued Oct. 2, 1990 entitled "Laser Interconnect Process" by H. S. Cole, et al.; U.S. Pat. No. 4,884,122 issued Nov. 28, 1989, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. Pat. No. 4,882,200 issued Nov. 21, 1989, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. Pat. No. 4,933,042 issued Jun. 12, 1990, entitled "Method and Apparatus for Packaging Integrated Circuit Chips Employing a Polymer Film Overlay Layer" by C. W. Eichelberger, et al.; U.S. Pat. No. 4,897,153 issued Jan. 30, 1990, entitled "Method of Processing Siloxane-Polyimides for Electronic Packaging Applications" by H. S. Cole, et al.; U.S. patent application 289,944, filed Dec. 27, 1988, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al.; and U.S. patent application Ser. No. 454,545, filed Dec. 21, 1989, entitled "An Epoxy/Polyimide Copolymer Blend Dielectric and Layered Circuits Incorporating It" by C. W. Eichelberger, et al. Each of these Patents and patent applications is incorporated herein by reference.

This high density interconnect structure provides many advantages over prior art interconnection systems. In particular, it enables a very compact assembly of a multichip or multicomponent electronic system. This compact assembly minimizes the length of conductor runs which interconnect different chips and thus minimizes transit time delays between chips which can be an important factor in high speed systems. Further, unlike many prior art systems, this interconnection system facilitates high yield assembly of multichip circuits because the high density interconnect structure can be removed from a malfunctioning system without damage to good chips. After removal of the high density interconnect structure, faulty or marginal chips can be removed from the substrate and replaced with other chips. After replacement of any faulty chips, a new high density interconnect structure is formed on top of the chips and substrate. Alternatively, if the cause of the malfunction is in the high density interconnect structure itself, no chip removal and replacement needs to be done before fabricating a corrected interconnection structure. As a consequence of this reworkability, a production yield of essentially 100% is achieved by repairing any malfunctioning systems.

The above identified background high density interconnect structure patents and applications have focused, in their illustrative embodiments, on the interconnection of chips which are placed edge-to-edge for maximum density and then interconnected into digital computers and other systems. While not directly addressed in those background patents and patent applications, the illustrative embodiments therein assume that an overall system package or enclosure is large enough to enclose the high density interconnect structure. This assumption is clearly appropriate for such systems as digital computers, other electronic systems whose overall housing can be adapted to the high density interconnect structure's configuration. However, there are systems in which components that it might be desirable to interconnect using a high density interconnect structure must be placed directly adjacent to other portions of the system in a portion of a housing which either must have a predetermined configuration which is incompatible with a straightforward high density interconnection of the electronic components, or in which trade-offs are involved which make it desirable that the high density interconnect structure be made even smaller than is achieved with a straightforward rectangular high density interconnect assembly in which external contact pads for connection to other parts of a system are provided on the upper surface of the ceramic substrate of the high density interconnect structure. Consequently, a modified high density interconnect structure providing greater flexibility for adjustment to overall package constraints is desirable.

OBJECTS OF THE INVENTION

Accordingly, a primary object of the present invention is to provide a high density interconnect structure in which the lateral area required by the high density interconnect structure can be reduced without adverse effect on the interconnection function.

Another object of the present invention is to provide a high density interconnect structure with a flexible portion suitable for enabling relative movement between different portions of an electronic system interconnected by that structure.

Another object of the present invention is to provide a high density interconnect structure in which different components of the system may be disposed in different, non-parallel planes.

A further object of the present invention is to provide a rugged, flexible, high density interconnect structure.

A still further object of the present invention is to provide a means for assembling such a flexible high density interconnect structure in a reliable, high yield manner.

SUMMARY OF THE INVENTION

The above and other objects which will become apparent from the specification as a whole, including the drawings, are achieved in accordance with the present invention by a high density interconnect structure in which the completed dielectric/conductor overlay structure includes a flexible portion which is not bonded to a rigid substrate or carrier. For added ruggedness, this flexible portion of the high density interconnect structure may include a support member which is bent in the process of bending the flexible portion of the high density interconnect structure out of the plane of one portion of the system in a manner in which the conductors of the high density interconnect structure are held in compression (that is, disposed on the concave side of the bent support member) so as to prevent introduction of adverse, stress-induced effects or changes in the conductor structure as a result of bending the flexible portion of the high density interconnect structure.

Several different methods may be used to produce such a flexible high density interconnect structure. One method is to place the substrate containing the chips or other components to be interconnected in a temporary carrier or fixture which has a larger area than the final interconnect structure will have and which also contains an interconnect support layer which may be selectively removed from the high density interconnect structure after completion of the high density interconnect structure fabrication process. The high density interconnect structure dielectric/conductor overlay is then fabricated on top of the carrier, support member, substrate and chips. After completion of the fabrication of this high density interconnect structure, the chips, substrate, support member and the overlying portion of the high density interconnect structure may be removed, as a unit, from the carrier by appropriate means such as cutting the dielectric layers of the high density interconnect structure along the edge of the desired interconnect structure to allow removal of the completed desired structure from the carrier (the interconnect structure is preferably bonded to the carrier during fabrication for quality control reasons). Alternatively, the carrier could be removed by being dissolved in a solvent or etchant or by other means.

Thereafter, where an unsupported flexible portion of the high density interconnect structure is desired, the support member is selectively removed from that region to leave the dielectric/conductor overlay structure unsupported in that area. Alternatively, where the high density interconnect structure is to be bent upward away from the previous location of the carrier, the support member may be relatively thin and left in place and bent to hold the high density interconnect structure in a desired position with the high density interconnect conductors in compression because they are disposed on the inside of the curve created by bending the support member.

Where desired, the dielectric layer or layers of the high density interconnect structure may be removed to leave conductive tab extensions of the high density interconnect conductors for connection of the high-density-packaged system to external systems or components.

Where greater ruggedness of such conductive tabs is desired, those tabs may initially be part of a lead frame to which the dielectric of the high density interconnect structure are bonded and appropriate conductors of the high density interconnect structure are connected during the high density interconnection fabrication process. The individual tabs may be separated from each other following completion of the HDI fabrication process by severing a connecting portion of the lead frame. Under such circumstances, the high density interconnect structure dielectric layers are preferably left bonded to a portion of each of the conductive tabs to provide added support for the tabs. An edge connector card may also be used.

As an alternative to the use of a separate support layer to support the portion of the high density interconnect structure which will be rendered flexible at the end of the fabrication process, appropriate portions of the carrier or other support system may be left free of high density interconnect adhesive when laminating the initial dielectric layer of the high density interconnect structure to the chips and substrate, provided that an appropriate mechanism for removing heat from those portions of the dielectric during metal deposition by high energy processes such as sputtering. Glues and adhesives which are differentially dissolvable relative to the high density interconnect adhesive, vacuum hold-down and so forth may be used to provide sufficient dielectric/substrate thermal contact to provide this heat removal. This renders the final high density interconnect structure easily separable from those portions of the carrier or fixture. As a further alternative, release layers may be incorporated in the fabrication process in appropriate locations to allow subsequent separation of the high density interconnect structure from the carrier, substrate or other support structure as may be considered desirable.

Efficient cooling of the final system can be provided by removing all supporting structures after completion of fabrication and test to leave just electronic components bonded to the high density interconnect structure which may then be "rolled up" and placed in a coolant flow. The coolant may be freon in a gas expansion cooling system or a liquid or gas which remains in that state.

A "picture frame" portion of a support member may be retained on the high density interconnect dielectric to maintain dimensional stability in the dielectric area within the picture frame to hold contact pads within the high density structure in alignment for bonding to a separate structure by soldering, laser welding and so forth.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 8-10 illustrate some alternative manners of supporting the substrates and high density interconnect structure during the fabrication process in order to facilitate provision of a flexible high density interconnect structure;

FIG. 18 illustrates a flexible high density interconnect having the chips and other components bonded directly to it and free of substrates; and FIG. 19 illustrates the structure of FIG. 18 "rolled up" and inserted in a coolant flow channel.

DETAILED DESCRIPTION

Figure 1:
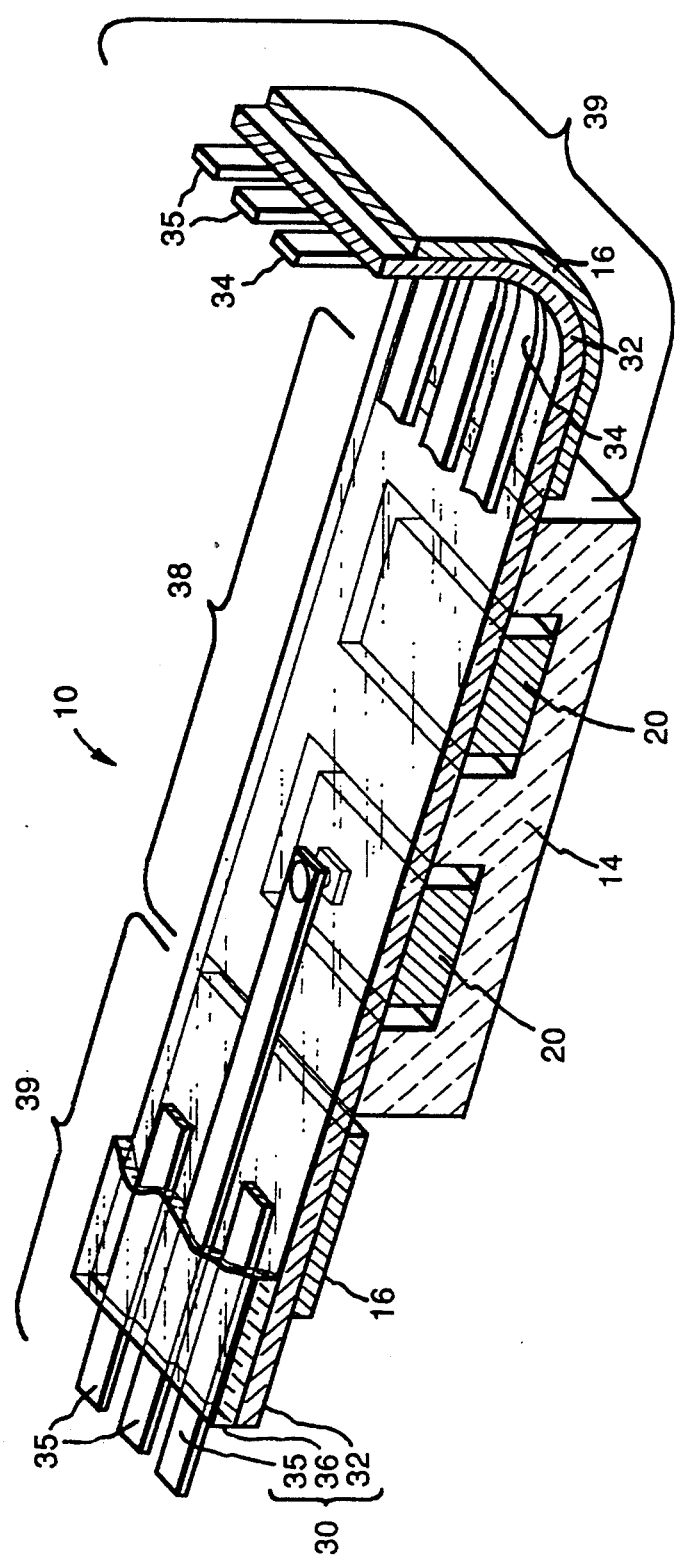
FIG. 1 illustrates a high density interconnected system including a flexible portion which allows the I/O lines of the interconnect structure to be bent out of the plane of the substrate.

FIG. 1 is a three-dimensional view of a system 10 comprised of a substrate 14 having a plurality of chips 20 mounted in a cavity or cavities therein and having a high density interconnect structure 30 in accordance with the present invention bonded to the upper surface of the chips and substrate and providing electrical interconnections among the chips and to the outside world. Substrate 14 may preferably be alumina or another electrically insulating thermally conducting material whose thermal coefficient of expansion closely matches that of the chips 20. The high density interconnect structure 30 comprises a dielectric layer 32 which may preferably comprise a thermoset layer of polyimide which may preferably be KAPTON ® polyimide available from E. I. DuPont de Nemours which is adhesively bonded by a thermoplastic adhesive to the upper surface of the chips, the substrate and a support member 16. The thermoplastic adhesive may preferably be a polyetherimide resin available from General Electric Company under the trade name ULTEM ®.

The support members 16 may preferably be Kovar ® or another low expansion coefficient metal whose thermal coefficient of expansion closely matches that of the alumina substrate 14. This is to facilitate manufacture of this interconnect structure by assuring that differences in thermal coefficients of expansion do not interfere with proper fabrication of the structure. Further, use of ferric chloride as an etchant to remove kovar is compatible with the rest of the high density interconnect structure materials and process steps. Kovar is readily available in 10–20 mil thicknesses which are thicker than necessary for this use and stiff enough that a thinner sheet or foil of kovar is desirable for bending.

A pattern of metal conductors 34 is disposed on the upper surface of the dielectric layer 32 and makes contact to various contact pads (only one shown) of the chips 20 through via holes (only one shown) in the dielectric layer 32. It will be noted, that this interconnection structure includes unique features when fabricated by first forming the dielectric layer on the underlying structure, then forming the via holes by "drilling" from above in the dielectric layer and then depositing the metal of the conductors 34. In particular, the external configuration of the metal in the via hole takes on the shape of the via hole, rather than vice versa as would be the case if the metal in the via hole were formed first and the dielectric filled in around it. This typically results in a via hole which is wider at the top than at the bottom because of the nature of the laser drilling process. This also provides improved metal continuity between the rest of a conductor and the portion of it which is disposed in the via hole, since the via hole surface on which the metal in the via hole is deposited has a sloping-upward-and-outward configuration which is known from the semiconductor arts to provide a deposited metallization layer with better step coverage than is provided by a vertical wall. Further, when made in the preferred manner described in the background Patents and patent applications, the metal conductor's upper surface has a depression or dimple in it over the via hole because the metal is deposited to a substantially uniform thickness rather than up to a particular plane. The conductors 34 are shown cut-away and omitted (except for one) over the substrate 14 for drawing clarity and because the connection of high density interconnection conductors to the chips and substrates is the subject of earlier patents and applications which are listed above and which fully describe the resulting structure and the process of making it. A second dielectric layer 36 is disposed over conductors 34 and dielectric layer 32. These structures are well described and illustrated in background HDI U.S. Pat. No. 4,783,695 as well as others. The portion 38 of the interconnect structure which is disposed on substrate 14 and chips 20 is a rigid structure which is firmly adhered to the substrate and chips. To the left and right of the substrate 14 in FIG. 1, the interconnect structure portions 39 are flexible. As illustrated at the right-hand side of the figure, the support member 16 and the associated portion of the interconnect structure are bent upward relative to the plane of the substrate in a smooth curve to place the conductive lines 34 perpendicular to the plane of the upper surface of the substrate 14. At the upper end of this bent structure in the figure, conductive tabs 35, which are continuous with the conductors 34 within the dielectric structure, protrude beyond the dielectric structure. The tabs 35 may comprise the same conductor material in the same cross-sectional configuration as the conductors 34. In that event, these exposed tabs are initially formed as parts of the conductive runs 34 and made protruding by selectively removing the dielectric of the interconnect structure adjacent to those tabs. This removal may be done by laser ablation, by immersion of that portion of the interconnect structure in a solvent for the dielectric material (if there is such a solvent) or by other means appropriate to the particular materials used in fabricating the structure. Similar conductive tabs 35 extend beyond the dielectric at the left-hand end of the figure.

When the support member 16 is bent from a planar configuration into the configuration illustrated in FIG. 1, it places the conductive lines 34 of the interconnect structure in compression because the interconnect structure is on the concave side of the support member 16 (this is referred to as an inside bend) and because the interconnect structure (dielectric and conductors) is more elastic than the support member. This is desirable since it ensures that the lines 34 will not fracture due to stresses. While in a typical application of such a flexible interconnect structure, the tabs 35 at the left-hand side of the figure would normally be either in the plane of the substrate or bent in the same direction as the portion of the structure to the right of the substrate, this structure may be bent downward relative to the substrate. The support member 16 should be omitted at such a bend in the interconnect structure, since otherwise, the interconnect conductors 34 would lie on the convex side of the support member (this is referred to as an outside bend) and would be placed in tension because the interconnect structure (dielectric and conductors) is more elastic than the support member. Such a configuration is considered undesirable because of the risk of stress-induced failures in the relatively thin conductors 34 despite the fact that they are preferably made of highly ductile copper. The support layer can be retained in an outside bend without risk or with reduced risk by thinning the support member in a uniform manner, by using a very thin support member to begin with (preferably about 3 to 5 mils thick, or by selectively removing the support member to leave a thick "picture frame" of the support member along the edges of the structure where no conductors are and across the ends of the bend to hold the sides of the frame in position. If desired, a second layer of conductors could be disposed on dielectric layer 36 and, if desired, a third dielectric layer could be disposed over those conductors.

Figure 2:
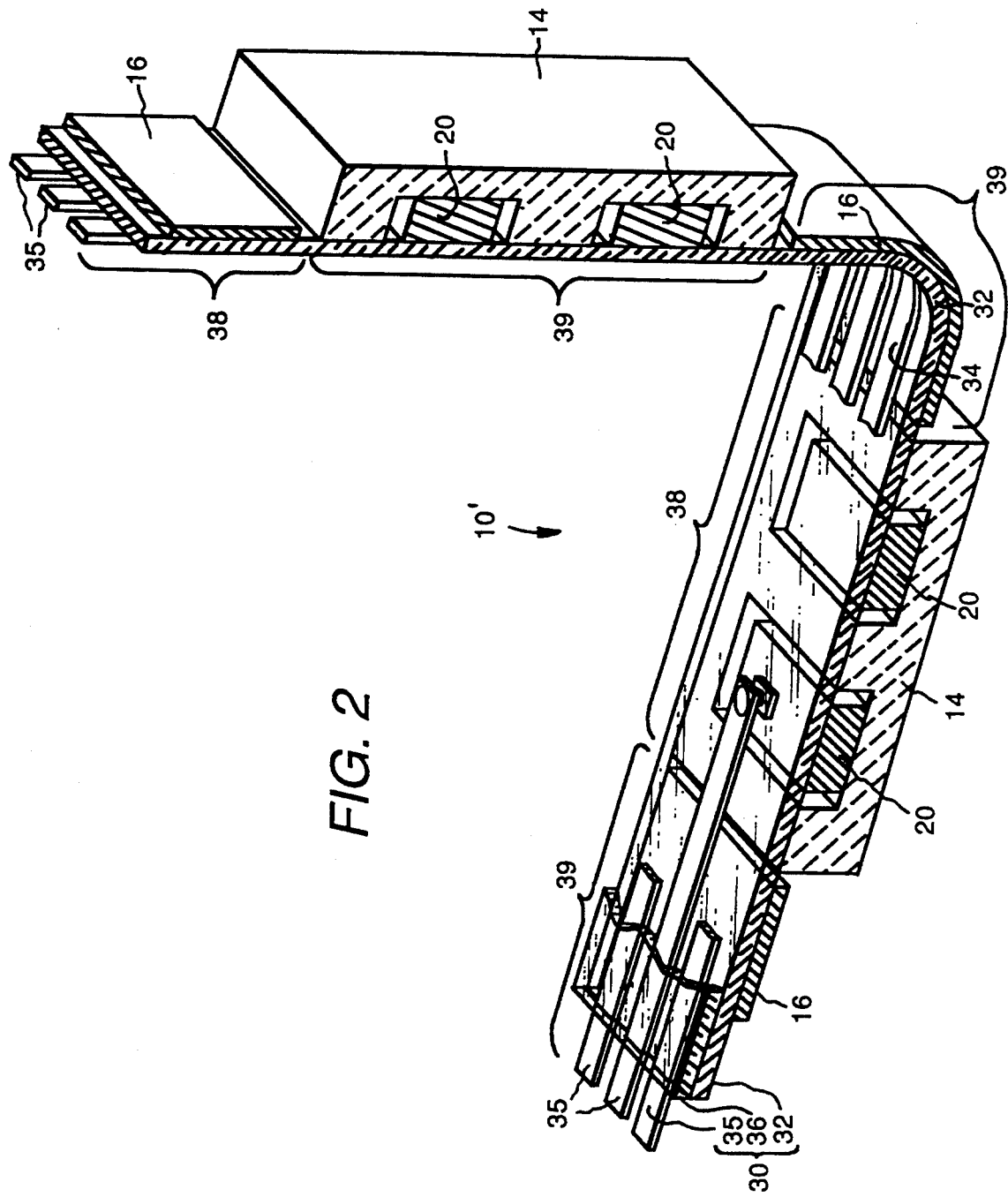
FIG. 2 illustrates a high density interconnected system which includes two substrates or modules, which in their final configuration, are disposed in non-parallel planes and interconnected by a bent, flexible portion of the high density interconnect structure.

A further embodiment 10' of the invention is illustrated in a three dimensional view in FIG. 2. This structure is similar to the FIG. 1 structure 10 with the exception that the system employs two separate substrates 14 or modules which are spaced apart by a flexible portion 39 of the interconnect structure which is bent to place the two substrates 14 in perpendicular planes. In this specification reference numerals which are the same in different figures identify similar elements which serve similar functions. Often these elements are discussed only with respect to the first figure in which they appear. A reference numeral to which a prime ('), a double prime (") or an asterisk is suffixed identifies a modified element which serves a similar function to the element identified by the plain reference numeral As illustrated in FIGS. 1 and 2, the interconnect structure comprises two dielectric layers and a single metal interconnect layer. Alternatively, a single dielectric layer (32) could be used or two conductive layers in combination with two or three dielectric layers and two conductive layers could be used.

Use of the flexible HDI interconnect structure carries with it a potential disadvantage that the overall high density interconnect system is physically larger than it might be if fabricated in a strictly rigid configuration. Consequently, propagation delays will be increased by the increased lengths of the interconnecting conductors. However, there are many systems in which propagation delays in the external leads of the high density interconnect system are not as crucial to overall system operation as electrical delays between the various components which are connected on the substrate 14 by the high density interconnect structure. Consequently, in many systems, the flexible high density interconnect structure will provide substantial packaging and/or system advantages without introducing any significant system detriments.

Figure 3:
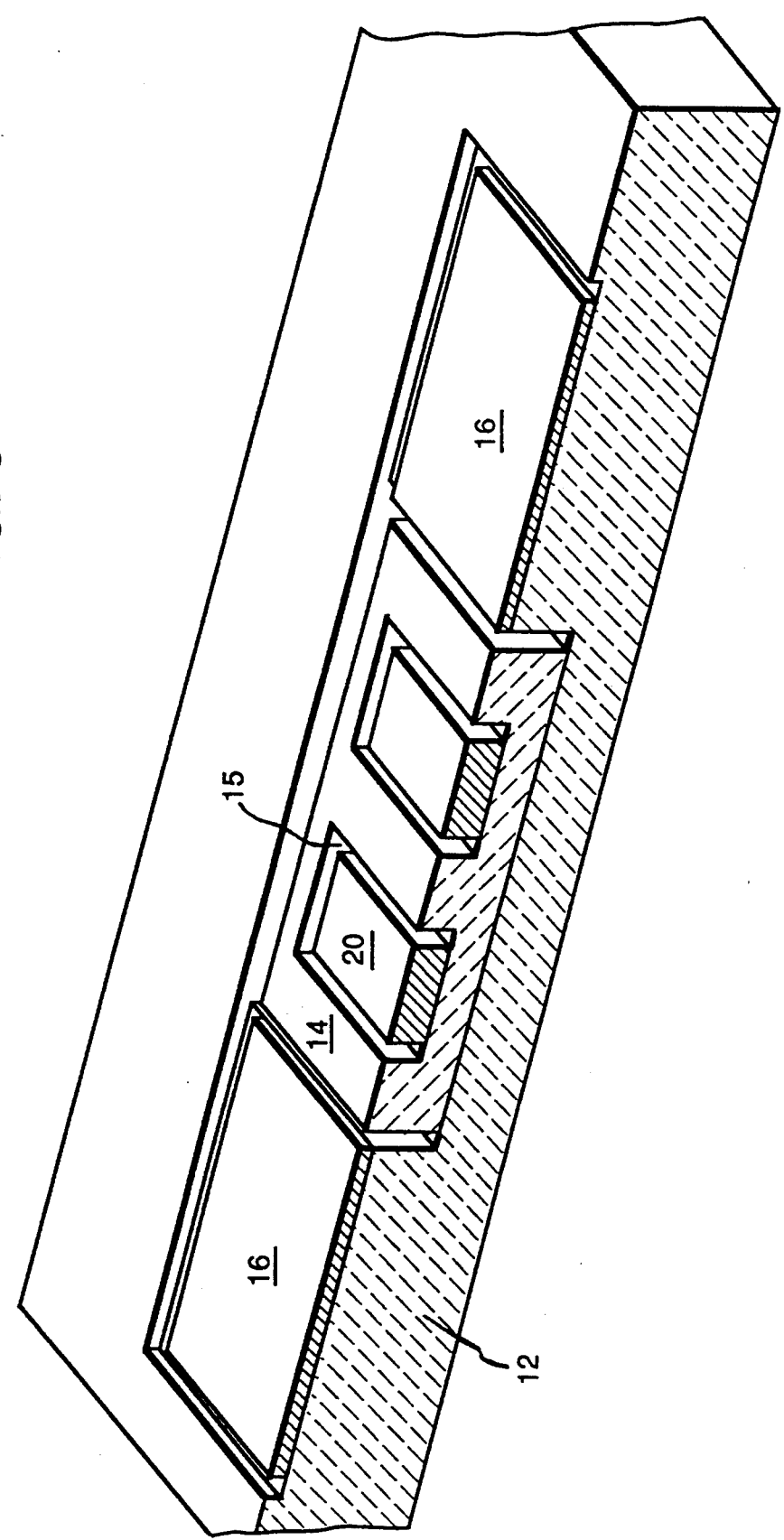
FIGS. 3-7 illustrate successive steps in a process for fabrication of a high density interconnect structure which includes flexible portions.

A method of fabricating this high density interconnect structure will now be described. In FIG. 3, the components of the system 10 are illustrated ready for the fabrication of the high density interconnect structure. In particular, the substrate 14 and the support members 16 are disposed in a carrier 12 in depressions or cavities whose depths are selected to place the upper surface of the support members 16 in the same plane as the adjacent portion of the upper surface of the carrier 12 and the upper surface of the substrate 14. Within the substrate 14, the chips 20 are placed in appropriate cavities 15 which place their upper surfaces in that same common plane. This co-planar alignment of the upper surfaces of the various portions of the structure is to facilitate fabrication of the high density interconnect structure as is explained in some of the background patents and applications.

Figure 4:
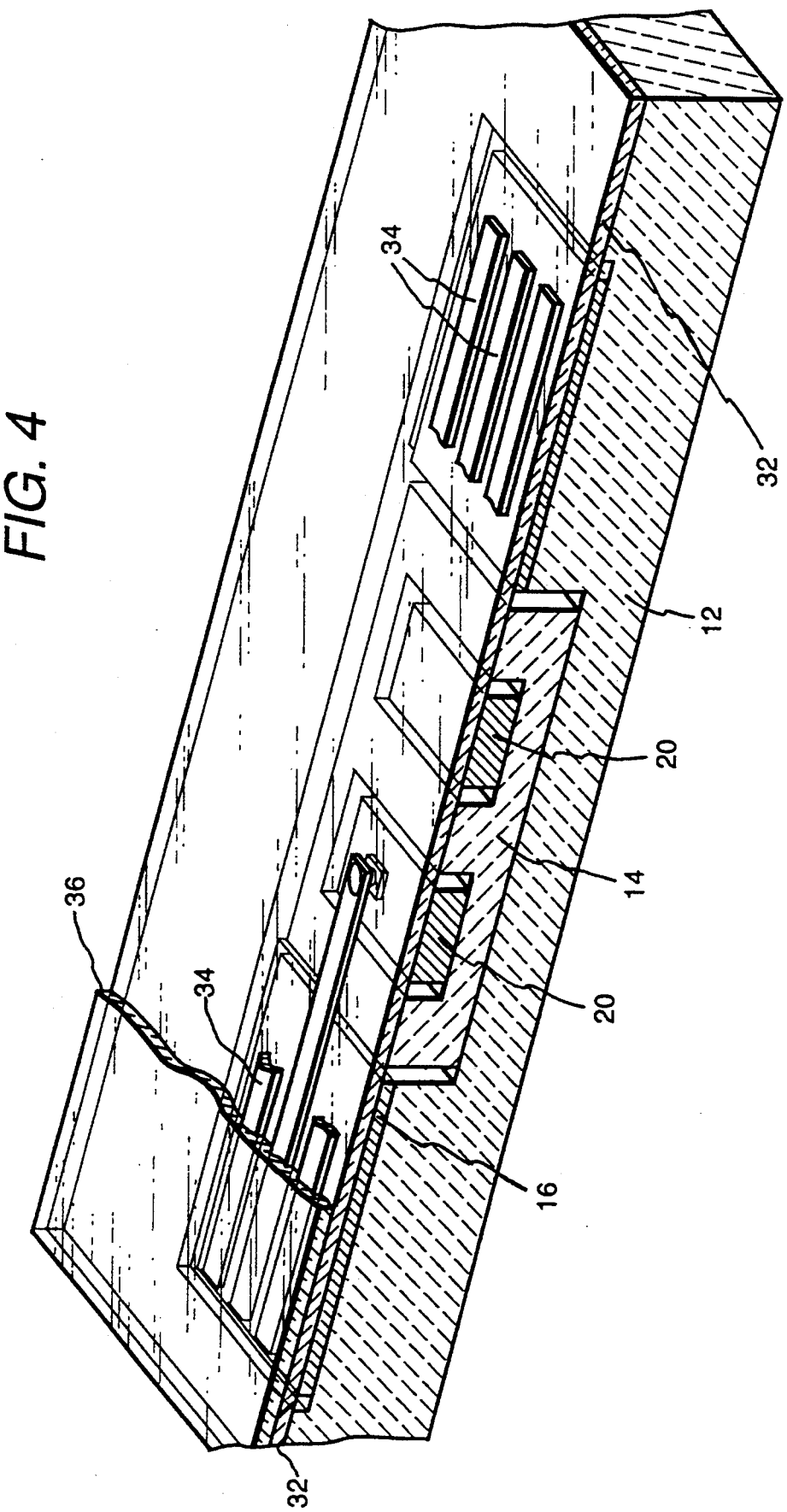

In FIG. 4, a completed high density interconnect overlay structure 30 is illustrated overlying the carrier 12, the substrate 14, the support members 16 and the chips 20. Depending on the complexity of the system and the particular application, additional dielectric layers and interconnecting conductor layers may be provided in the manner taught in the background patents. The detailed process for fabricating this structure has been explained briefly in the Background Information portion of this specification and is explained in much more detail in the background high density interconnect U.S. Patents and patent applications cited above.

Figure 5:
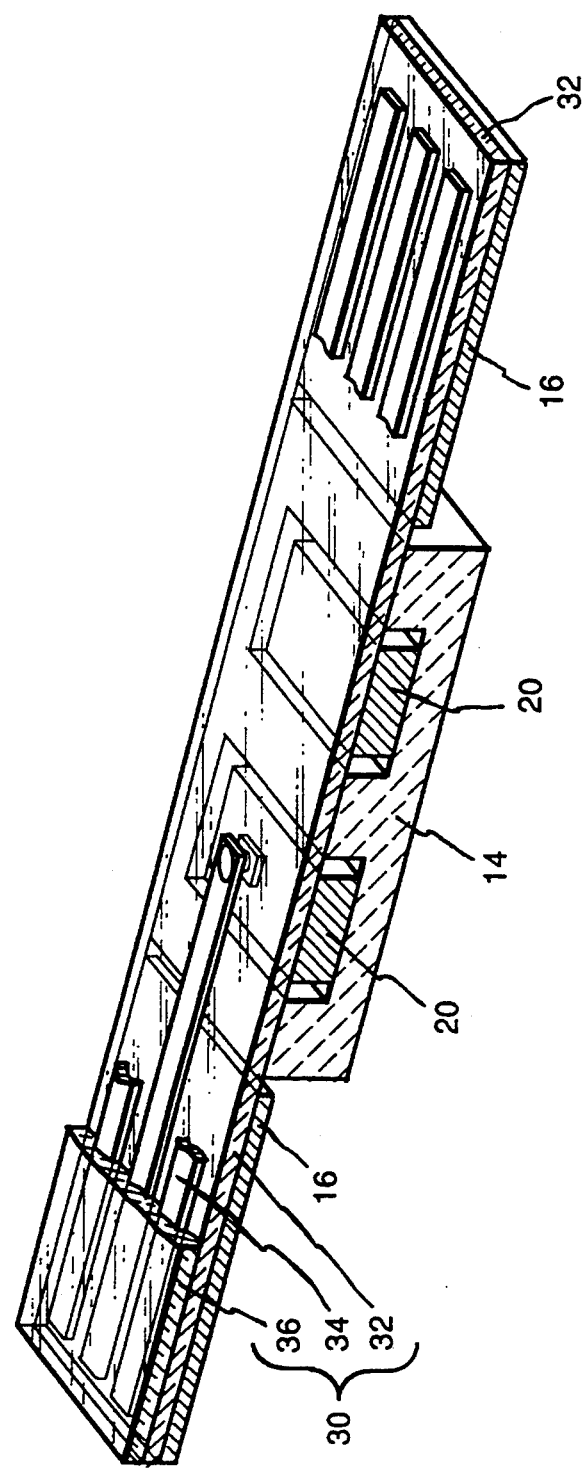

At the stage illustrated in FIG. 4, the process of fabricating this high density interconnect structure 30, which is described in the background patents and applications, is complete in the sense that all of the interconnections and dielectric layers are present. At this stage of the process, the interconnect structure is ready for removal from the carrier 12. This may be done by cutting the high density interconnect structure along the boundary between the upper surface of the carrier 12 and the support members 16 and the substrate 14. This cutting may be done with a knife or other sharp object or by laser cutting. It is preferred to have all of the interconnection conductors 34 spaced from this cut line in order to assure that no damage to the conductors will occur during this cutting process. Since any conductors 34 crossing this cut line would be cut anyway, there is normally no need for such conductors to cross these cut lines. After structure 30 is cut and the system is removed from the carrier 12, the high density interconnect structure appears as illustrated in FIG. 5.

If desired, the conductors 34 may cross the cut line to connect the "final" structure to temporary test structures and contact pads for connection to test systems to facilitate testing of the complete interconnected system prior to cutting of interconnect structure at the cut line. Use of such a testing structure facilitates repair of the system in the simplest manner in the event that reworking of the system should be necessary, since the various components are still mounted in the carrier at this stage of the process.

Figure 6:
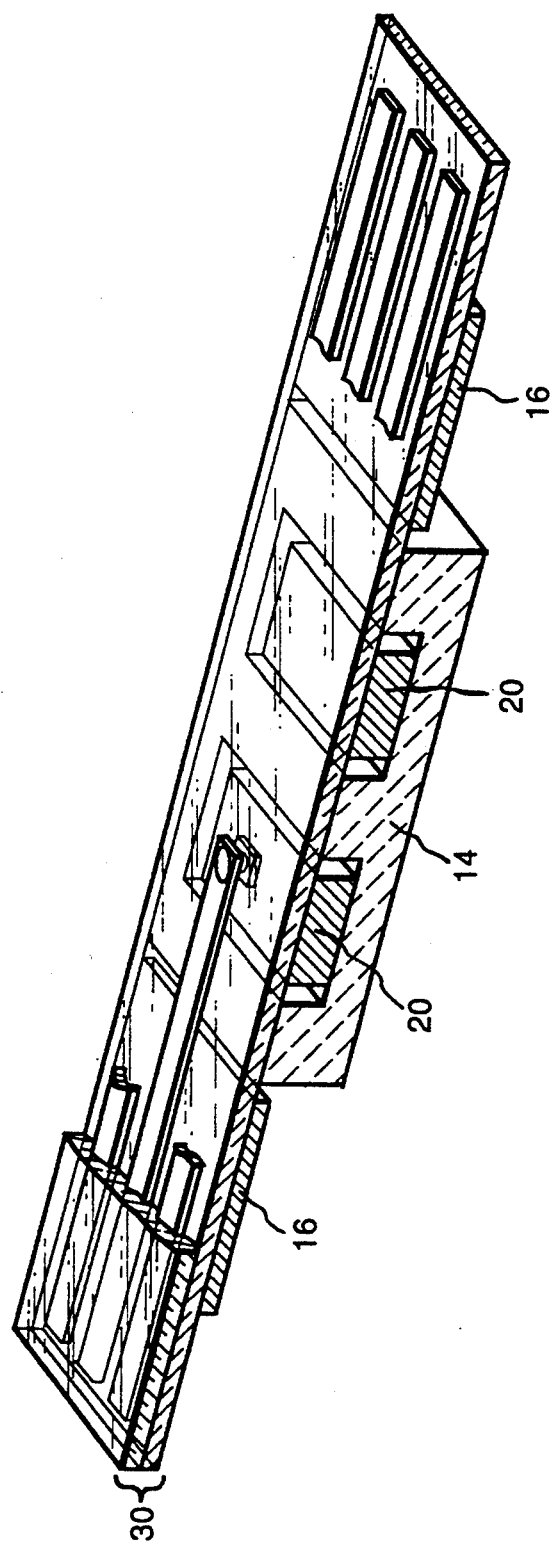

At this stage, the left-hand and right-hand wings or extensions of the high density interconnect structure beyond substrate 14 (which are bonded to the support members 16), are flexible in the sense that they can be bent upward in the figure without damage to the structure, provided the support members 16 are appropriately thin. Where it is desired to provide greater flexibility or to be able to bend the interconnect structure in the opposite direction without risk to the conductors, appropriate portions of the support members 16 may be selectively thinned in a uniform or patterned manner or may be completely removes, as may be preferable in the particular application. This removal or thinning may preferably be done by ferric chloride spray etching in the case where the support members are Kovar ®. The structure shown in FIG. 6 has the support member 16 selectively removed from both the left-hand end and right-hand end of the structure. It will be understood that support member 16 may alternatively be completely removed or not removed at all.

Figure 7:
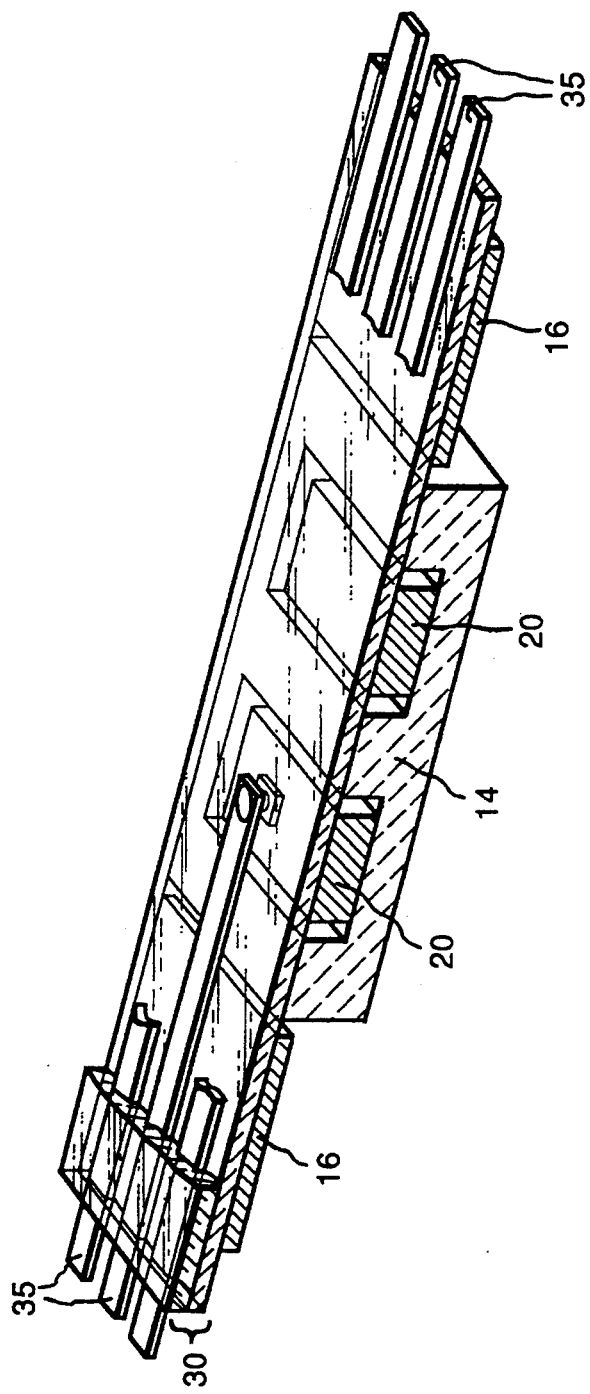

In order to provide tabs for bonding the interconnect structure to a larger system, it may be considered desirable to provide exposed conductive tabs 35 at the end of the structure as illustrated in FIG. 7. Where this is considered desirable, the dielectric layer of the interconnect structure may be removed by laser ablation, by being dissolved in a solvent (if one is available for the dielectrics used) or by other means as may be appropriate to the particular materials of which the system is fabricated. Where the dielectric layer includes a thermoset polyimide material, solvent dissolving of the dielectric is not generally feasible with the result that laser ablation or other appropriate techniques should be used. Since the tabs 35 are merely portions of the high density interconnect metal which extend beyond the dielectric, they are extremely fragile due to the typical dimensions for such conductors of from 2 to 20 mils wide by from 2 to 10 microns thick. Consequently, appropriate care must be used in forming, handling and bonding these tabs. While the tabs 35 are shown disposed at the end of the high density interconnect structure, it should be understood, that if desired, the conductors 34 could be exposed at an intermediate location instead of or in addition to at the end of the high density interconnect structure.

FIGS. 8-10 illustrate alternative means to the FIGS. 3-7 means of rendering the to-be-flexible portions of the high density interconnect structure removable from the carrier. In particular, in FIG. 8, mosaic blocks or support members 16' are provided in the cavity in the carrier 12' between the substrates 14 and the edges of the cavity and between adjacent substrates. In laminating the first layer of dielectric 32 to this carrier and the substrates, the high density interconnect adhesive is omitted from the mosaic blocks 16' so that the lamination process does not bond the dielectric to these portions of the structure. While it would be desirable to leave these portions of the structure completely unbonded to facilitate subsequent removal of the completed structure from the carrier, process and material limitations normally prevent this from being done. In the presently preferred method of fabrication, the initial metal adhesion promotion layer is applied to the KAPTON ® polyimide layer by sputtering. This is a high energy process which transfers on the order of 10 watts of energy to the KAPTON per square inch. This tends to heat the film causing outgasing, dimensional distortion and adhesion poisoning which prevent good metal adhesion. With the film bonded everywhere, the substrate, chips, support members and carrier provide a sufficiently effective heat sink to carry this heat away without significant detrimental effects. This is true even where a 40-50 mil span of the KAPTON is left unsupported or unbonded. However, an unbonded span of 100 mils yields marginal characteristics and longer spans become unusable. Several effects are involved in this. First, without adequate heat sinking, the applied energy heats the KAPTON film which leads to thermal distortion of the film in the form of crinkling, warpage and so forth. Further, this thermal distortion also prevents metal adhesion with the result that the metal will not stay in place. In marginal situations, poor metal adhesion can result even if crinkling and warpage are not apparent. For this reason, if sputtering or other high energy processes are used to deposit even the first layer of metal on the KAPTON film, the film must be adhered to some form of heat sink during the metal deposition process. Techniques which may be used include using a different glue or adhesive on the mosaic blocks 16' to sufficiently adhere the film for heat sinking purposes while making them removable by dissolving in a solvent which is inert to the desired portions of the high density interconnection structure. Subsequent dissolving of the alternative adhesive can be facilitated by making the carrier 12 porous or providing it with access holes through which the solvent for the adhesive can be provided directly to the adhesive during the high density interconnect/carrier separation process. Vacuum hold-down can be used if sufficient thermal contact can be achieved despite the vacuum environment in which the sputtering process takes place. Alternatively, if the metal is deposited by a lower energy process which does not cause an undesirable increase in thermal energy in the KAPTON, then, these regions may be left unbonded. Such alternative processes can include sputtering of thinner layers or at a slower rate. Thus, where a thin titanium layer is deposited directly on the Kapton for adhesion promotion and a layer of copper is deposited thereon, less heating results when that copper layer is only made thick enough to ensure complete coverage of the titanium (to prevent the formation of titanium oxide when the part is removed from the sputtering chamber), unbonded segments of Kapton may be as long as about 200 to 250 mils. Another alternative process is electroless deposition of the metal, although choosing electroless deposition as the metal deposition technique may undesirably limit the metals which can be used.

Following completion of the fabrication of the high density interconnect structure, the interconnect structure, including the substrate and chips, may be cut from the carrier 12' near the left-hand end of the carrier at the gap between the mosaic block 16' and the ledge of the carrier and near the right-hand end of the carrier between the block 16' and the ledge or lip of the carrier. Thereafter, when the high density interconnect structure is removed, the blocks 16' remain behind, leaving fully flexible portions of the high density interconnect structure at those locations.

Alternatively, as illustrated in FIG. 9, the support blocks 16' may be omitted and replaced by portions of the carrier 12" itself which are kept adhesive free or differentially bonded as discussed above. In this case, the cutting is done at the edge of the adhesive bonded portions of the high density interconnect structure nearest the ends of the carrier. These adhesive free portions may be provided by use of a mask during adhesive deposition.

As illustrated in FIG. 10, adhesive may be applied to the entire structure and a release layer which does not bond to the adhesive or a pair of superimposed release layers 17 which do bond to the adhesive, may be placed in the locations where the flexible-interconnect structure is desired. While in the illustrated cross-section the release sheets appear to be three laterally spaced-apart pieces, it will be understood that, in fact, they are preferably continuous stencils or templates having holes therein in the locations where adhesion of the high density interconnect structure is desired. Thus, the release layers in this embodiment are in the form of a rectangular figure "8", assuming the structure is only one substrate wide in the direction perpendicular to the paper (it could be two or more substrates wide in that direction, if desired). A suitable material for such a release layer is DuPont's PFA Teflon, although many other dielectric or conductive materials can be used. The overlying dielectric layer 32 is then laminated to this structure and the fabrication of the high density interconnect structure proceeds as previously described.

Figure 11:
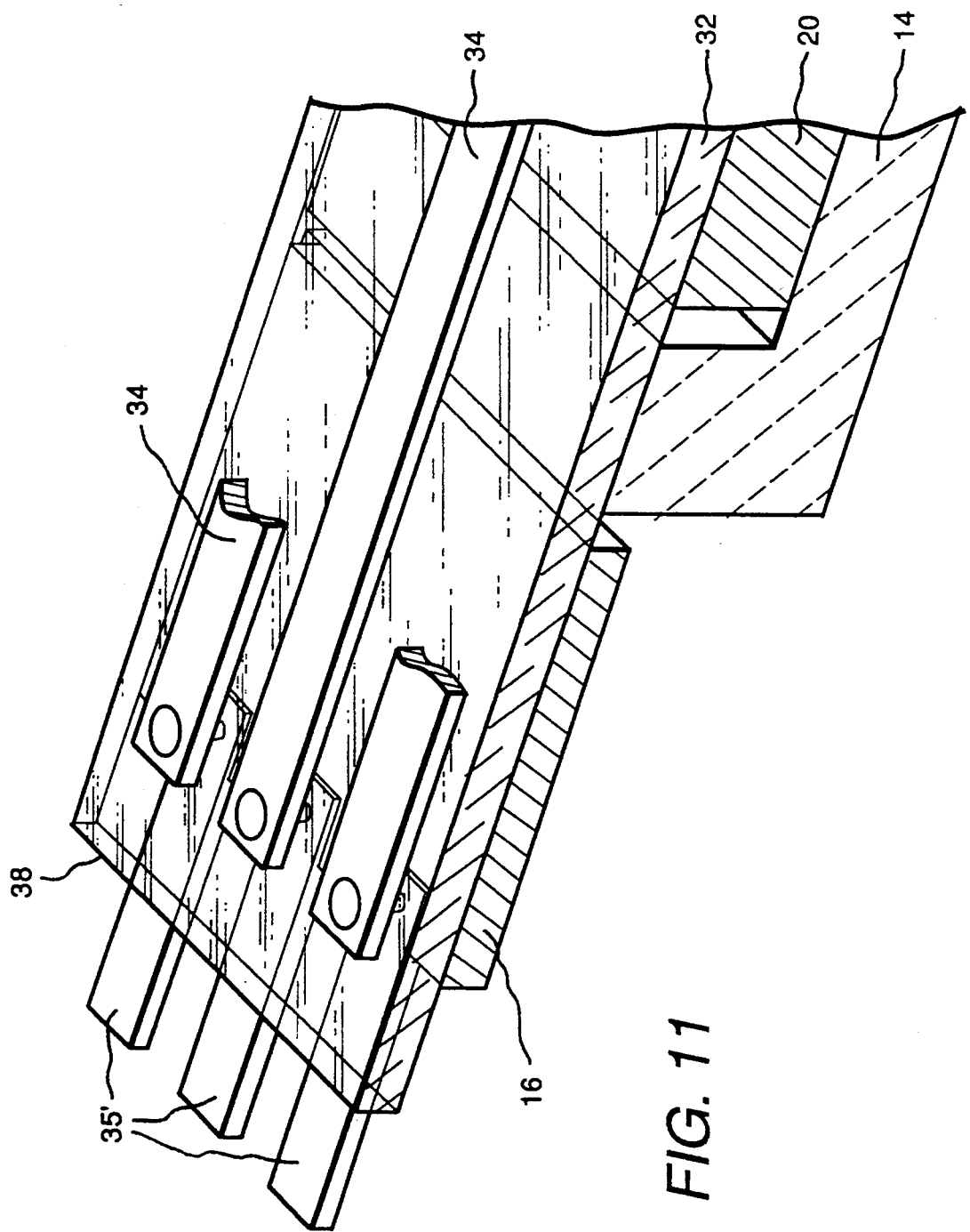
FIG. 11 illustrates an embodiment which includes metal foil, sheet or other rugged connection tabs which extend from the flexible high density interconnect structure at the end of the process.
Figure 12:
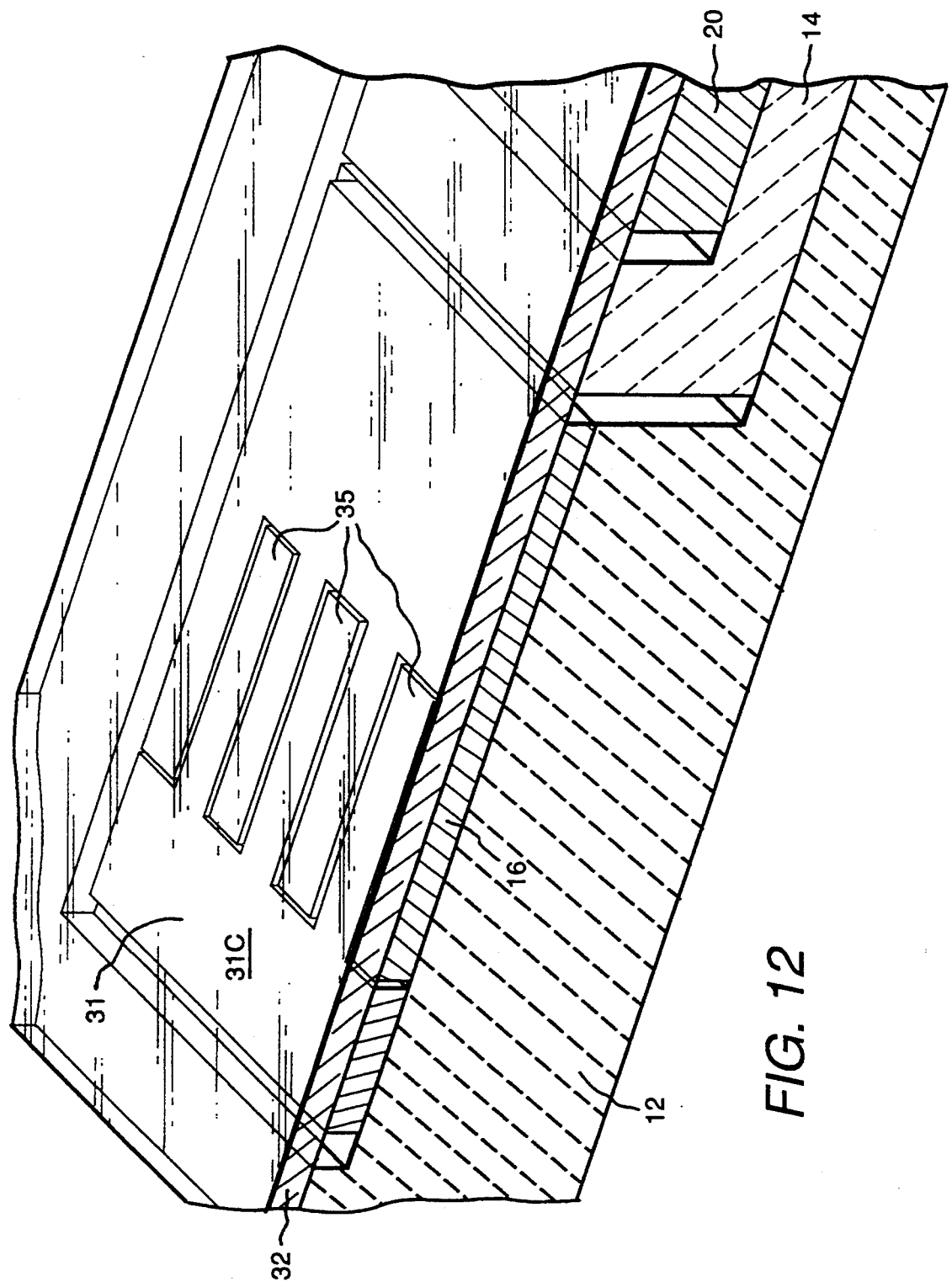
FIGS. 12 and 13 illustrates two stages of a modified fabrication process which leads to the FIG. 11 structure.

One concern with respect to the connection tabs 35 as described above, is that they can be extremely fragile due to the manner of their production as part of the built-up interconnect-structure conductors which are not normally made so thick as to be highly durable in such an exposed application. As an alternative to the use of such extensions as the external connection tabs, lead frame tabs 35' may be included in the structure as shown in FIG. 11. In FIG. 11, the connection tabs 35' which extend from the high density interconnect structure are substantially thicker than conductor runs within the high density interconnect structure and are connected to the conductors within the high density interconnect structure in the same manner as other connections (through via holes in intervening dielectric material).

Figure 13:
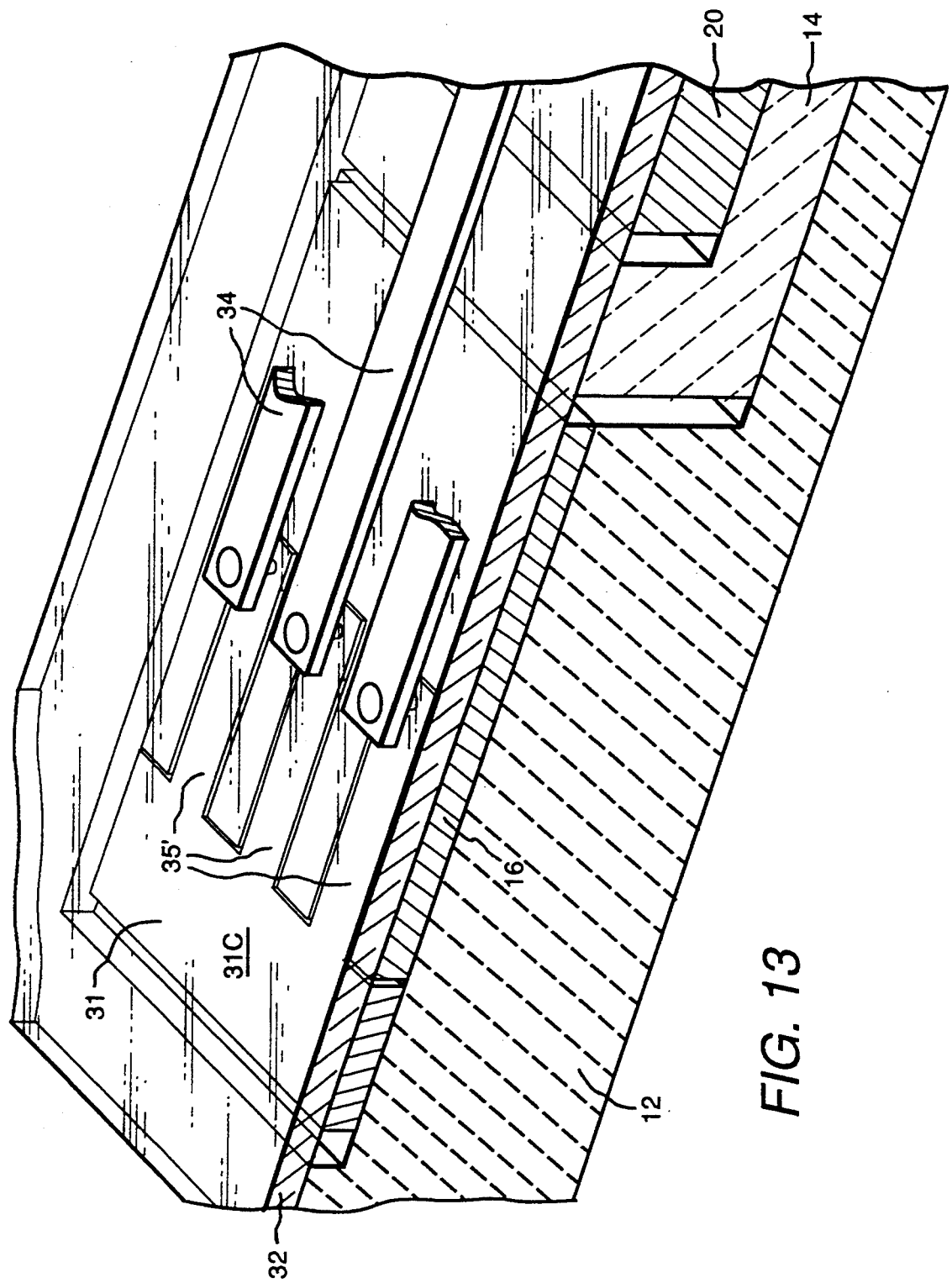

In FIG. 13 a comb-like lead frame 31 is intermessed with a comb-like support member 16 to provide a substantially planar surface to which the dielectric layer 32 is bonded. The lead frame 31 comprises a plurality of connection tabs 35' and a connecting member 31C which holds the connection tabs in fixed relative locations during the fabrication process. The lead frame 31 is placed in the same carrier cavity as the support member 16. Alternatively, the support member 16 may be a part of the lead frame (with the individual tabs 35' being separated form the rest of the support member, except at their connection to the connecting portion 31C) or the tabs may be isolated by selective removal of the support member after the completion of the fabrication process.

The dielectric layer 32 is then bonded to the structure. Thereafter, via holes are formed in dielectric layer 32 and the connecting metal runs formed on top of that dielectric layer and extending into those via holes.

This leaves tabs 35' exposed on the underside of the dielectric of the interconnect structure at the end of the fabrication process.

During the fabrication process, the appropriate ones of the interconnection conductors of the high density interconnect structure are formed in ohmic contact with appropriate ones of the tab leads 35'. Following removal of this completed high density interconnect structure from the carrier 12, the connecting portion 31C of the lead frame is severed from the high density interconnect structure to leave physically separate conductive tabs 35'. Thereafter, the dielectric, which covers the to-be-exposed portions of the tabs 35' is selectively removed to expose those portions of the tabs.

Figure 14:
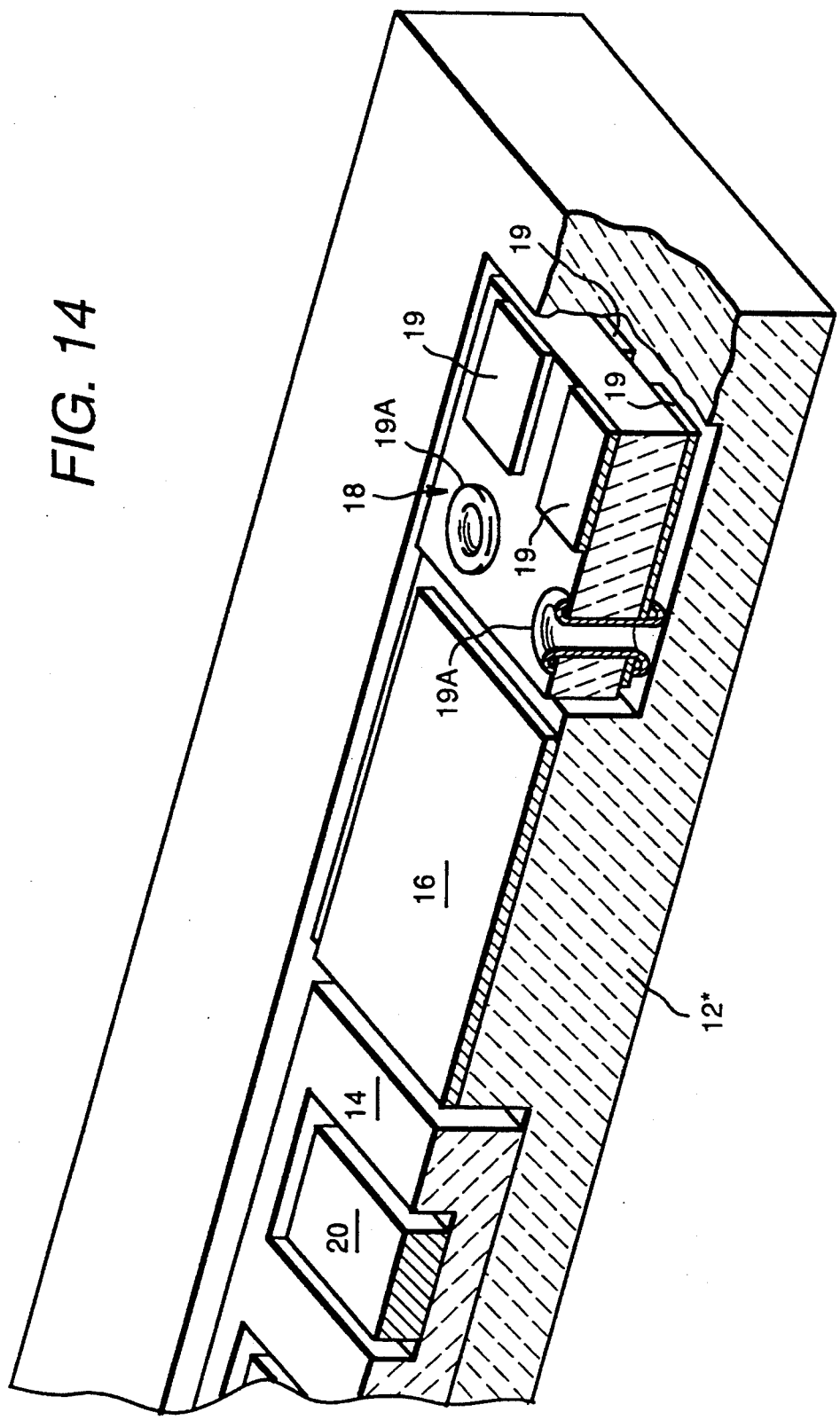
FIG. 14 illustrates a substrate and an edge connector card ready for interconnection.

As a further alternative for providing connection tabs, an edge connector "card" or another preformed connector module may be flexibly or rigidly connected to an HDI interconnect structure as may be appropriate to an overall system package. In FIG. 14, a portion of a modified carrier 12* is illustrated having a substrate 14 disposed therein along with support members 16 and an edge connector card 18 which are ready for fabrication of a high density interconnect structure thereon which will interconnect the chips 20 of the substrate 14 and the edge connector contacts 19 of the edge connector card 18. As illustrated, the edge connector card 18 has electrically separate contacts disposed on opposite sides of the card, but aligned with each other. The electrically separate contacts on the lower side of the card in the figure are brought to the upper surface through eyelets, rivets, plated through or filled holes, etc. 19A for connection to the high density interconnect structure conductors in a substantially planar manner as has been described. It will be understood that following fabrication of the high density interconnect structure, the entire system, including the substrate 14 and the edge connector card 18, is removed from the carrier as a unit in a manner similar to those in which earlier described embodiments are removed from their carriers. After completion of the fabrication of the high density interconnect structure, the high density interconnect dielectric can be removed from the edge connector contacts 19 in a manner similar to that in which the dielectric is removed from the connection tabs 35, such as by laser ablation, or in this case by including release layers over the ends of the contacts as part of the fabrication process. The flexible portion of the high density interconnect structure which is, at least during fabrication, disposed on the support member 16 serves to flexibly connect the edge connector card to the high density interconnect structure substrate 14 with the result that the edge connector card may be positioned in any of a variety of desirable orientations relative to the substrate 14. Instead of a double-sided edge connector card, a single sided edge connector card could be used. In that situation, it is considered preferable to orient the card with its contact side up in the figure so that there is no need bring lower-side contacts to the upper surface for connection to the high density interconnect structure conductors. Alternatively, the edge connector card can be a printed circuit board which includes other components in addition to an edge connector. As a further alternative, the edge connector contacts can be formed as part of the high density interconnect structure fabrication process.

Figure 16:
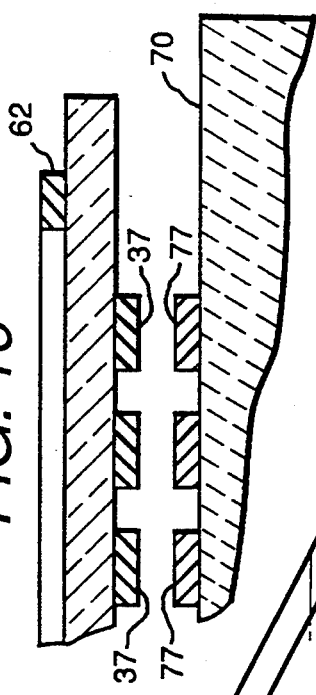
FIG. 16 is a side view of the FIG. 15 structure illustrating the alignment of the contact pads of its two parts.
Figure 15:
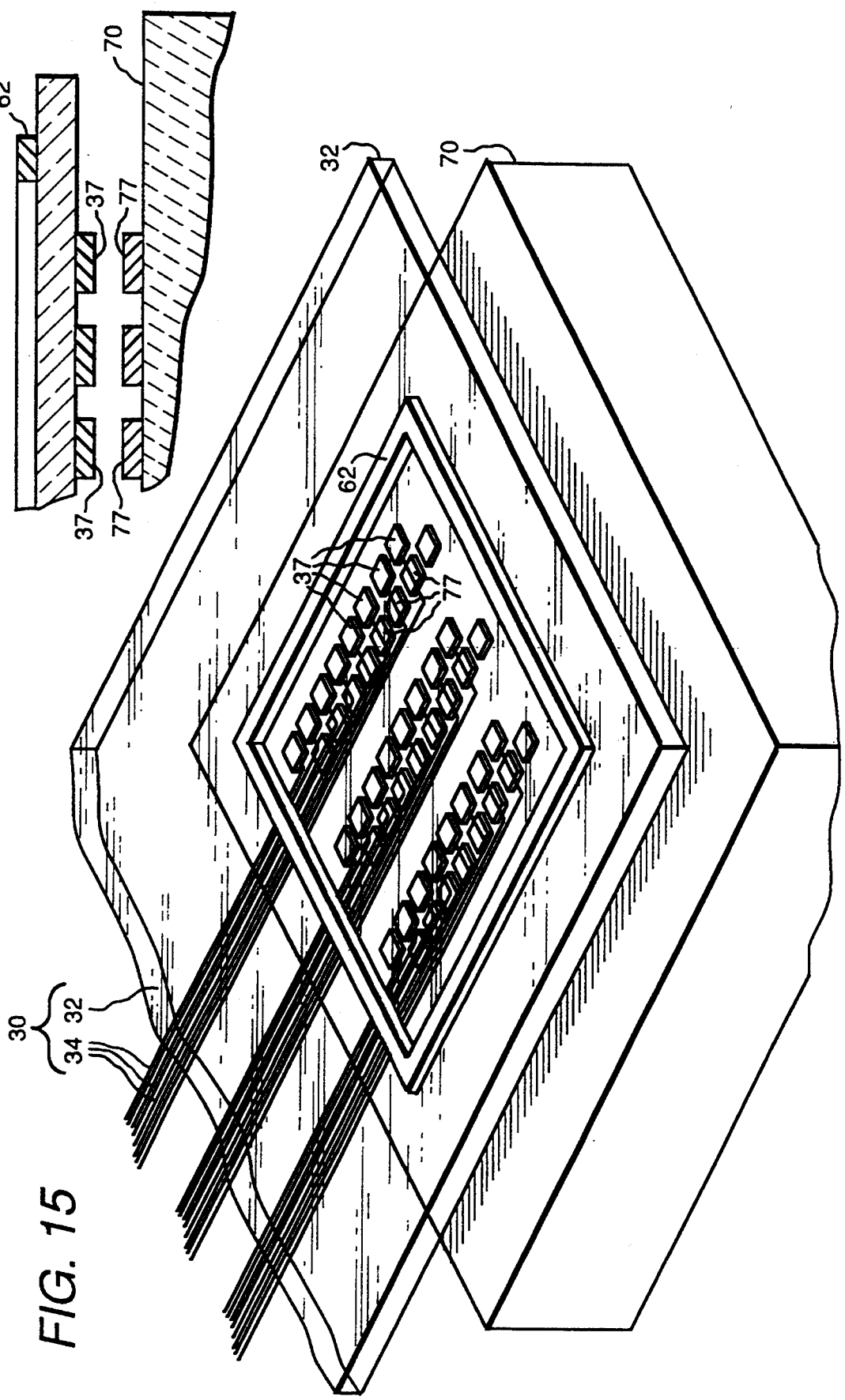
FIG. 15 illustrates an array contact pad arrangement for connection of the completed flexible high density interconnect structure to an external portion of the system.

In FIGS. 15 and 16 an alternative configuration for connecting a flexible high density interconnect structure to an external portion of a system is illustrated. The illustrated portion of the flexible high density interconnect structure includes a picture or support frame 62 which is bonded to the dielectric of the high density interconnect structure 30. The frame 62 is the remaining portion of a support member 16 from which the interior portion of the support member has been selectively removed. Thus, the structure illustrated in FIG. 15 is inverted relative to the other illustrations in the sense that the support member side of the structure is illustrated as being upward in the figure. As may be seen more clearly in FIG. 16, the contact pads 37 are exposed at the lower surface of the interconnect structure 30 and have been configured and positioned for direct alignment with contact pads 77 on an external portion 70 of the system to which this flexible high density interconnect structure is to be connected. Removal of the central portion of the support member to leave the picture frame 62 enables the contact pads 37 of the high density interconnect structure to be visually aligned with the contact pads 77 of the external portion 70 of the system. The picture frame 62 itself is retained in order to maintain the high density interconnect structure 30 in proper tension so that its dimensional stability remains intact during the process of aligning and bonding the pads 37 to the corresponding pads 77. Any of a wide variety of bonding processes may be used to bond the Pads 37 to the pad 77. These include solder bump bonding and the use of thermal fellow to create the bond between the pads 37 and the pads 77, the use of conductive adhesives and the use of laser welding, among others. The conductors 34 which connect to the contact pads 37, are illustrated as single lines for drawing clarity and because depending on the size and spacing among the pads 77, the pads 37 may be substantially wider than the conductor lines 34.

Where a large number of closely spaced small contact pads 37 are required, the conductors 34 may be disposed in a variety of layers in the high density interconnect structure in order to fit the required number of conductors 34 into the space available between rows of the contact pads 37.

Following bonding of the pads 37 to the pads 77, the picture frame portion 62 of the support member may be left in place or may be removed as by ferric chloride etching in the case of Kovar as may be considered desirable for the particular system.

If it is desired to retain the frame 62 as a permanent part of the system, but presence of conductive material in that location is undesirable, then the frame may be prefabricated out of dielectric material and provided with a support member 16 within its opening during the fabrication process. That support member is then removed after completion of the high density interconnect structure fabrication process. In such circumstances, the frame may be ceramic or any other appropriate dielectric material. Prefabrication of the frame is unnecessary when a dielectric which can be selectively removed is used to form the frame.

Figure 17:
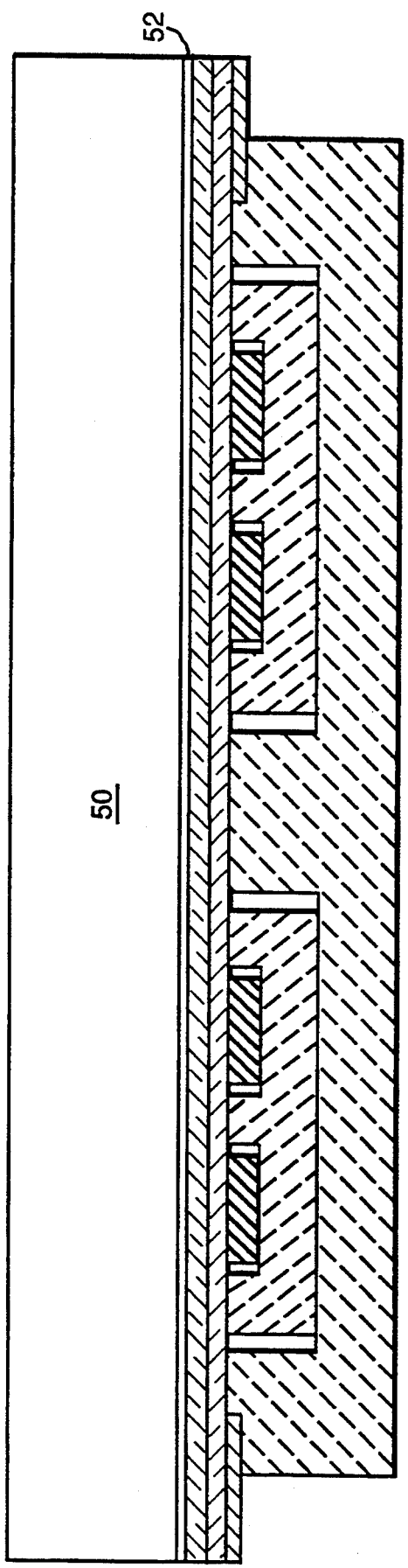
FIG. 17 illustrates a transfer type process for supporting the high density interconnect structure during selective or non-selective removal of a support member from that structure.

In FIG. 17, a process for selectively removing the support members 16 is illustrated. In FIG. 17, the interconnected system, including the substrate 14, the support member 16 and the interconnect structure itself has been bonded by an adhesive 52 at the upper surface of the interconnect structure to a block 50. This secures the interconnect structure in an easily handled, well-supported manner. The support members 16 may then be masked in a desired pattern (if selective removal of the support members is desired) and the exposed portions of those supports removed by spray etching. Where those support members are Kovar, ferric chloride is a preferred spray etchant. This high density interconnected structure may be left mounted on the block 50, if desired, or may be subsequently separated therefrom by dissolving the adhesive 52 which bonds the interconnect structure to the block in an appropriate solvent, by dissolving the block itself or by heating the structure to a temperature at which the adhesive 52 becomes sufficiently fluid that the interconnect structure may be easily slipped laterally off the block 50.

FIG. 18 illustrates an array of electronic components or chips 20 interconnected by a high density interconnect structure 30 which has been rendered flexible by removal not only of the carrier and any support members, but also by removal of the substrates 14 to leave just the electrical components connected by the high density interconnect structure 80. That is, the electronic components are free of external substrates. This structure may be advantageously used where space requirements are particularly tight with the result that even the substrate thickness creates problems and where the flexible interconnect structure must fit into a closely defined configuration which the presence of the substrate would prevent. While a two-dimensional array of chips is shown in FIG. 18, it will be understood that this is also applicable to linear arrays.

Another reason for removing the substrates can be in order to maximize thermal transfer in a structure such as that shown in FIG. 19. In FIG. 19, the system 80 has been "rolled up" to form a small, relatively compact spiral or cylinder and has been installed in a tubular housing 84 with an end of the interconnect structure extending through a sealing slot 85. The chips 20 and the portion of the structure 80 within the conduit 84 are disposed in a sealed coolant conduit through which a coolant, indicated by the arrows 86, is pumped in order to provide maximum cooling of the individual chips. The coolant 86 may be a liquid such as water, or a gas such as nitrogen, or a refrigerant (such as freon) of the type used in compressor driven cooling systems which rely on expansion of liquid to gas for cooling. Where the coolant 86 is such a refrigerant, it may be in either a liquid or a gaseous state at the time it enters the conduit 84 and begins passing the system 80. Depending on the flow rate of the coolant and the power dissipation and size of the system, coolant may emerge from the system 80 still in a liquid form, in a gaseous form or as a mixture thereof. This system configuration provides the ultimate in cooling by exposing the chips 20 directly to the coolant without any thermal interfaces therebetween.

While not shown in FIG. 19, a structure may preferably be provided to hold the various turns of the rolled up system 80 in fixed relation to each other. One appropriate structure for this purpose is a modified photographic film development film holder of the type used to hold an individual roll of film for development in a cylindrical-can film development system. That is, in which the edges of the film are held in spiral tracks in two circular caps which are mostly open space in order to facilitate the flow of film development chemicals therethrough. In the cooling environment, naturally, the openings in that modified rack are for the flow of the coolant rather than film development chemicals. Many other support techniques may also be used.

In FIG. 19, the system 80 is shown rolled with the chips 20 disposed on the outside of the roll, it will be recognized that the system can be rolled in the opposite sense so that the chips are disposed on the inward side of the dielectric layer of the system, as rolled. The system 80 may alternatively be left flat, folded or otherwise manipulated prior to insertion into an appropriate cooling chamber, or may be left unenclosed, if desired.

In each of the illustrative embodiments, a linearly arranged system is illustrated in which flexible portions of the interconnection structure extend only from two opposed ends of the chip containing substrate in the completed system. However, such flexible portions can extend in any desired direction, including four mutually perpendicular directions or at any other desired directions, as may be appropriate for a particular system being fabricated.

In each of the illustrative embodiments, the flexible portion of the high density interconnect structure has initially been formed over the carrier, rather than on the substrate in which chips are disposed, however, it should be understood that in a situation where it is considered desirable to have a flexible end to the interconnect structure itself, but the substrate length does not need to be overly restricted, the to-be-flexible portion of the high density interconnect structure can be fabricated directly over the substrate itself. In that situation, use of a release layer may be preferable to use of a support member to which the high density interconnect structure is bonded.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electronic system comprising:
an electronic component having a major surface having contact pads disposed thereon;
an interconnection structure of greater extent than said electronic component fabricated in part on said electronic component, said interconnection structure including
a layer of flexible dielectric material, and
a plurality of flexible conductors supported by said dielectric layer;
said interconnection structure including a flexible portion which is free of rigid support and which is free to bend, and a non-flexible portion which is constrained from bending; and
said dielectric of said interconnection structure being bonded to said major surface of said electronic component in said non-flexible portion of said interconnection structure, selected ones of said contact pads being connected to selected ones of said flexible conductors.

2. The electronic system recited in claim 1 wherein:
said contact pads are connected to said flexible conductors by conductive material disposed in via holes in said dielectric material.

3. The electronic system as recited in claim 1, wherein:
at least some of said flexible conductors are embedded between two dielectric layers.

4. The electronic system recited in claim 1 wherein:
a plurality of said flexible conductors include a segment which is free of said dielectric material.

5. The electronic system recited in claim 4 wherein:
said dielectric-free segment is disposed at an end of said flexible interconnection structure to provide connections tabs for connection to external circuitry.

6. The electronic system recited in claim 1 wherein:
said flexible interconnection includes conductive connection tabs which extend from an end thereof.

7. The electronic system recited in claim 6 wherein:
said conductive connection tabs are connected to said flexible conductors through conductive material disposed in via holes in said dielectric material.

8. The Electronic system recited in claim 6 wherein:
said conductive connection tabs are integral with said flexible conductors.

9. The electronic system recited in claim 1 wherein:
said system includes an edge connector connected to said electronic component by said flexible interconnection.

10. The electronic system recited in claim 1 wherein:
the flexible portion of said interconnection structure includes a support member bonded to the dielectric of said structure.

11. The electronic system recited in claim 10 wherein:
said support member is curved toward said dielectric layer to hold said flexible conductors in compression in a location where the flexible portion of said interconnection structure is curved.

12. An electronic system comprising:
a rigid substrate;
an electronic component having a major surface having contact pads disposed thereon, said electronic component being bonded to said substrate;
an interconnection structure of greater extent than said rigid substrate fabricated in part on said electronic component and said substrate, said interconnection structure including
a layer of flexible dielectric material, and
a plurality of flexible conductors supported by said dielectric layer;
said interconnection structure including a flexible portion which is free of rigid support and which is free to bend, and said dielectric layer being bonded to said substrate and said major surface of said electronic component to define a non-flexible portion of said interconnection structure which is constrained from bending; and
selected ones of said contact pads being connected to selected ones of said flexible conductors.

13. A high density interconnect structure comprising:
a plurality of electronic components each having a major surface with contact pads disposed thereon;
an interconnect structure fabricated in part on said electronic components and including
at least one dielectric layer, said dielectric layer being bonded to the major surfaces of said electronic components, and
at least one patterned conductor layer;
selected ones of said contact pads being connected to selected conductors of said patterned layer such that said conductors interconnect said electronic components;
said interconnect structure including a flexible portion which is free of rigid support and which is free to bend, and non-flexible portions which are constrained from bending, said non-flexible portions being bonded to said electronic components, and
at least some of said electronic components being free of external substrates.

14. The high density interconnect structure recited in claim 13 wherein:

at least a portion of said flexible interconnect structure is disposed in a spiral, whereby said electronic components are disposed in different planes.

15. The high density interconnect structure recited in claim 14 wherein:

said spiral is disposed in an external housing.

16. The high density interconnect structure recited in claim 15 wherein:

said external housing comprises a cooling conduit.

17. The high density interconnect structure recited in claim 13 wherein:

said electronic components are disposed in a coolant containing housing.

* * * * *